United States Patent
Hoo et al.

(10) Patent No.: US 7,994,647 B2
(45) Date of Patent: Aug. 9, 2011

(54) METHOD OF REDUCING MEMORY CARD EDGE ROUGHNESS BY EDGE COATING

(75) Inventors: Ong King Hoo, Shanghai (CN); Java Zhu, Shanghai (CN); Ning Ye, San Jose, CA (US); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/901,861

(22) Filed: Oct. 11, 2010

(65) Prior Publication Data
US 2011/0024891 A1 Feb. 3, 2011

Related U.S. Application Data

(62) Division of application No. 11/863,809, filed on Sep. 28, 2007, now Pat. No. 7,811,859.

(51) Int. Cl.
*H01L 23/29* (2006.01)
(52) U.S. Cl. ............... 257/793; 257/790; 257/E23.119; 257/E23.134
(58) Field of Classification Search .................. 257/790, 257/793, E23.119, E23.134
See application file for complete search history.

(56) References Cited

U.S. PATENT DOCUMENTS

| 6,498,074 | B2 | 12/2002 | Siniaguine et al. |
| 6,602,762 | B2 | 8/2003 | Hwan et al. |
| 7,091,062 | B2 | 8/2006 | Geyer |
| 7,413,927 | B1 | 8/2008 | Patwardhan et al. |
| 7,514,291 | B2 | 4/2009 | Akram |
| 7,665,201 | B2 | 2/2010 | Sjoedin |
| 2008/0277765 | A1 | 11/2008 | Lane et al. |
| 2009/0011543 | A1 | 1/2009 | Karta et al. |
| 2009/0189279 | A1 | 7/2009 | How |

OTHER PUBLICATIONS

Office Action dated Aug. 21, 2009, U.S. Appl. No. 11/863,809.
Response to Office Action filed Sep. 21, 2009, U.S. Appl. No. 11/863,809.
Office Action dated Jan. 6, 2010, U.S. Appl. No. 11/863,809.
Response to Office Action filed Mar. 8, 2010, U.S. Appl. No. 11/863,809.
Notice of Allowance and Fee(s) Due dated Jun. 4, 2010, U.S. Appl. No. 11/863,809.

*Primary Examiner* — David A Zarneke
(74) *Attorney, Agent, or Firm* — Vierra Magen Marcus & DeNiro LLP

(57) ABSTRACT

A method of forming a semiconductor package with smooth edges, and a semiconductor package formed thereby is disclosed. In embodiments, after encapsulation, the semiconductor packages may be at least partially singulated from the panel by making one or more cuts through the panel to define one or more edges of the semiconductor package. The one or more edges may be smoothed by applying a laminate to the edges. The edges receiving the laminate may include any edge between a top and bottom surface of the package.

21 Claims, 3 Drawing Sheets

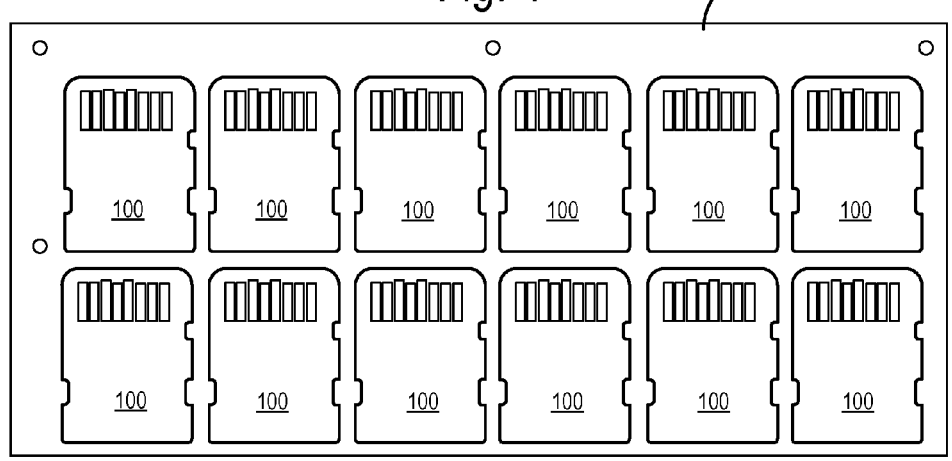
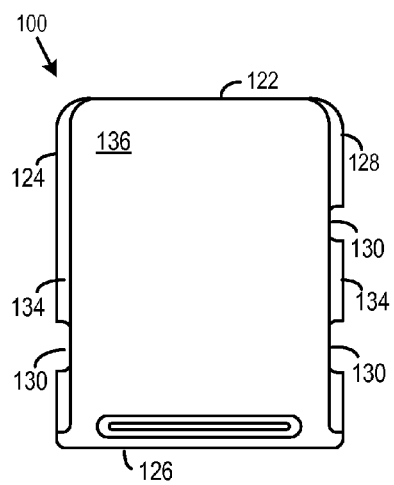
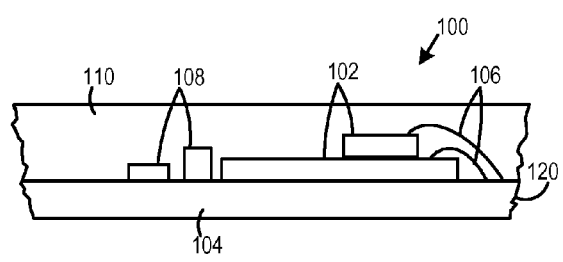

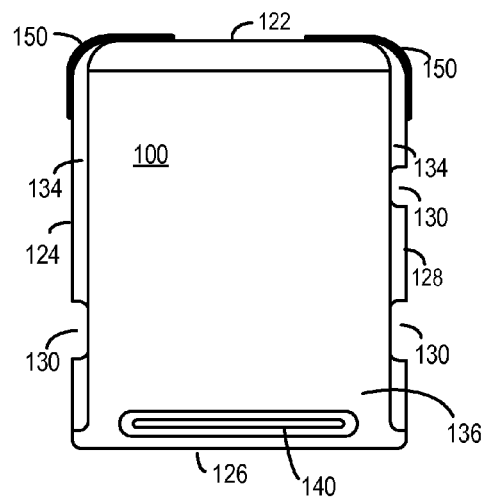
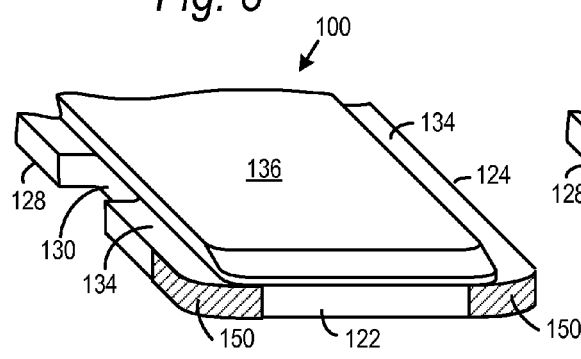
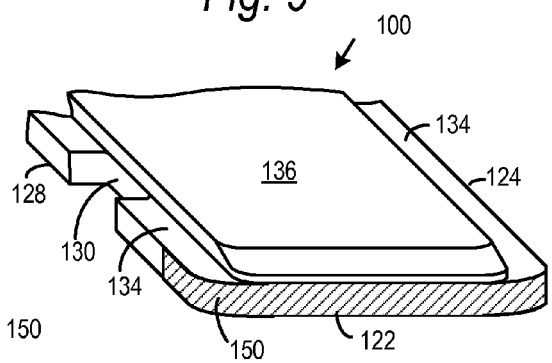

US 7,994,647 B2

METHOD OF REDUCING MEMORY CARD EDGE ROUGHNESS BY EDGE COATING

CLAIM OF PRIORITY

This application is a divisional of U.S. patent application Ser. No. 11/863,809 filed Sep. 28, 2007, entitled "Method Of Reducing Memory Card Edge Roughness By Edge Coating", which application is incorporated herein by reference in its entirety.

BACKGROUND OF THE INVENTION

1. Field of the Invention

Embodiments of the present invention relate to methods of smoothing the edges of a portable memory card and a memory card formed thereby.

2. Description of the Related Art

As the sizes of electronic devices continue to decrease, the associated semiconductor packages that operate within them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

While a wide variety of packaging configurations are known, flash memory storage cards may in general be fabricated as system-in-a-package (SiP) or multichip modules (MCM), where a plurality of die are mounted on a substrate. The substrate may in general be a printed circuit board, a leadframe or a tape automated bonding (TAB) tape. FIG. 1 shows a cross-section of a plurality of semiconductor packages 20 being fabricated on a substrate panel 22. Semiconductor packages 20 are typically batch processed from panel 22 for economies of scale. Each package 20 includes one or more semiconductor die 24 mounted to the substrate, and electrical bond wires 26 for electrically coupling the one or more semiconductor die to the substrate. The substrate may further include passive components 28, such as for example capacitors, resistors and inductors further enabling the operation of the package 20. Where the packages 20 are LGA (land grid array) packages such as are used in portable memory cards, contact fingers (not shown) may be formed on a surface of the substrate and coupled to the one or more semiconductor die through a lead pattern formed in the substrate. The contact fingers and lead pattern allow electrical communication between the semiconductor die in the package and a host device in which the package is used.

Once electrical connections between the die and substrate are made, the respective packages 20 on panel 22 may then typically be encapsulated in a molding compound to seal off and protect the components within the package. Once encapsulated, the respective packages 20 may be singulated from the panel 22 to form the finished packages. An example of a finished, encapsulated package is shown in prior art FIG. 2. The package 20 shown in FIG. 2 may for example be a Memory Stick Micro (M2) card developed by SanDisk Corporation of Sunnyvale, Calif. and Sony Corporation of Tokyo Japan, which commonly used in cellular telephones and other mobile devices.

Many conventional semiconductor packages, like package 20 in FIG. 2, have both straight and curvilinear edges. The package 20 in FIG. 2 includes a generally rectangular shape having sides 32 through 38 joined by rounded corners. Side 32 of the package 20 further includes a pair of notches 40 and side 36 includes a single notch 40. Many other types of memory cards similarly include a curvilinear shape having rounded edges, notches, and/or a chamfer, including the Transflash and the Secure Digital (SD) card.

Several methods are known for cutting the straight edges of a package 20 during singulation, including for example diamond saw. However, specialized cutting methods are required for cutting curvilinear shaped edges during singulation. Such specialized cutting methods include, for example, water jet cutting, laser cutting, water guided laser cutting, dry media cutting and diamond coated wire cutting. Such cutting methods are able to achieve sophisticated rectilinear and/or curvilinear shapes of the individualized integrated circuit packages. A more detailed description of methods for cutting encapsulated integrated circuits from a panel, and the shapes which may be achieved thereby, is disclosed in published U.S. Pat. No. 7,094,633, entitled "Method for Efficiently Producing Removable Peripheral Cards," which patent is assigned to the owner of the present invention and which patent is incorporated by reference herein in its entirety.

As semiconductor packages continue to shrink, the structure within a host device for receiving and ejecting portable memory packages is becoming more delicate, and the ejection force with which smaller packages are ejected from the host device is getting smaller. Consequently, the roughness of the edges of portable memory packages is becoming a significant factor in package design, as small memory cards having rough edges may get stuck inside the host device.

Known cutting methods for cutting straight edges are effective at achieving smooth cuts. A measurement of roughness is Ra (average roughness), which is the measure of the average height of the bumps on a surface, measured for example in microns (μm). Straight edge cutting methods are typically able to achieve a roughness of Ra<1 μm. However, where a package includes curvilinear edges and is singulated by methods such as water jet or laser singulation, the edges are relatively more rough, typically about Ra=3 to 6 μm or greater. An example of a cut forming edges made by such methods is shown in prior art FIG. 3. FIG. 3 shows the packages 20 encapsulated in a mold compound 46 and including edges 50 defined by curvilinear cutting methods. As shown, the edges 50 of the package may be jagged, and may more easily get stuck within a host device.

In order to improve the surface roughness of package edges, it is known to grind package edges using for example a grinding wheel and/or polish package edges using for example a polishing rod. However, such methods do not sufficiently reduce edge roughness, and the tooling and equipment required adds cost to the fabrication process.

SUMMARY OF INVENTION

The present invention, roughly described, relates to a method of forming a semiconductor package with smooth edges, and a semiconductor package formed thereby. In embodiments, after encapsulation, the semiconductor package may be at least partially singulated from the panel by making one or more cuts through the panel to define one or more edges of the semiconductor package. According to embodiments of the invention, the one or more edges may be smoothed by applying a laminate to the edges. The edges receiving the laminate may include any edge between a top and bottom surface of the package.

The laminate may be a variety of compounds applied as a liquid and thereafter cured or hardened to form a solid, smooth layer around the edges to which it is applied.

In one embodiment, the laminate may be an ink epoxy applied as an A stage liquid and then cured to a C stage solid. The laminate may harden either at atmospheric temperature or by curing.

In embodiments, the laminate may be applied after the package has been singulated from the panel. In such embodiments, the laminate may be manually swabbed onto the desired locations of the package. Alternatively, the package may be transferred to a holding station and the laminate applied robotically.

BRIEF DESCRIPTION OF THE DRAWINGS

FIG. 4 is a top view of a panel of semiconductor packages including curvilinear cuts partially singulating the packages from the panel.

FIG. 5 is a top view of a singulated semiconductor package prior to application of a laminate according to the present invention.

FIG. 6 is a cross-sectional view of the semiconductor package shown in FIG. 4.

FIG. 7 is a top view of a semiconductor package including a laminate according to the present invention.

FIG. 8 is a partial perspective view of a semiconductor package including a laminate according to the present invention.

FIG. 9 is a partial perspective view of a semiconductor package including a laminate according to an alternative embodiment of the present invention.

DETAILED DESCRIPTION

Figure 1:
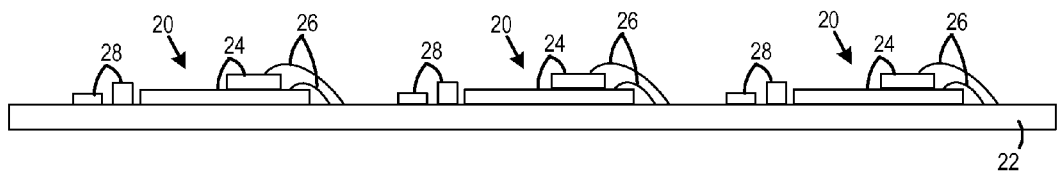
FIG. 1 is a side view of a plurality of integrated circuits formed on a substrate panel according to the prior art.
Figure 2:
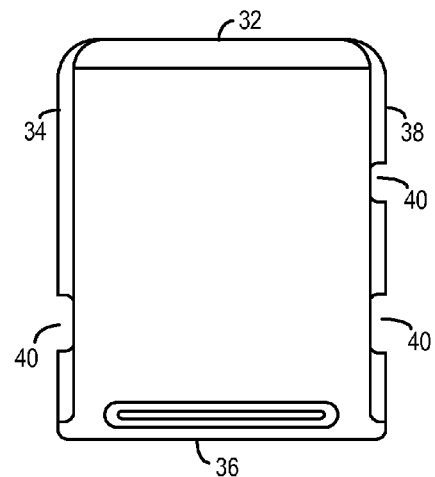
FIG. 2 is a top view of a singulated semiconductor package according to the prior art.
Figure 3:
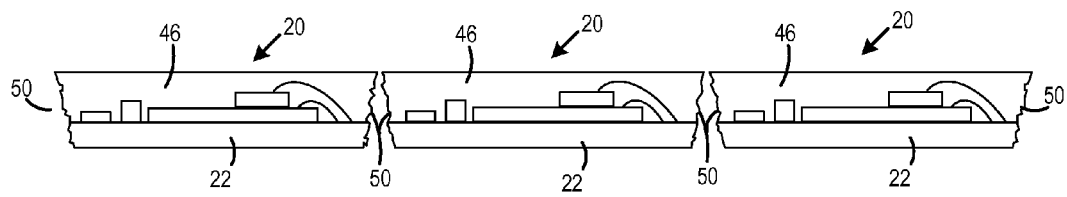
FIG. 3 is a side view of a plurality of singulated semiconductor packages including rough edges formed by certain cutting processes of the prior art.

The embodiments of the present invention will now be described with reference to FIGS. 4 through 9, which generally relate to a method of forming a semiconductor package including a laminate for reducing the surface roughness of package edges, and a semiconductor package formed thereby. It is understood that the present invention may be embodied in many different forms and should not be construed to being limited to the embodiments set forth herein. Rather, these embodiments are provided so that this disclosure will be thorough and complete and will fully convey embodiments of the invention to those skilled in the art. Indeed, the invention is intended to cover alternatives, modifications and equivalents of these embodiments, which are included within the scope and spirit of the invention as defined by the appended claims. Furthermore, in the following detailed description of embodiments of the present invention, numerous specific details are set forth in order to provide a thorough understanding of the present invention. However, it will be clear to those with ordinary skill in the art that the present invention may be practiced without such specific details.

Referring initially to the top view of FIG. 4, in general, semiconductor packages according to the present invention may be batch processed from a panel 90 including a plurality of semiconductor packages 100 formed thereon for economies of scale. FIG. 4 shows a two dimensional array of semiconductor packages 100, but it is understood that the panel from which packages 100 are formed may include varying numbers of packages across the length and/or width of the panel.

FIGS. 5 and 6 show top and cross-sectional side views, respectively, of a package 100 singulated from panel 90. The composition and method of fabrication of the package 100 shown in FIGS. 5 and 6 may vary greatly in alternative embodiments. In one embodiment, each package 100 may include one or more semiconductor die 102 mounted to a substrate 104. Although not critical to the present invention, the die 102 may include one or more flash memory chips, and possibly a controller such as an ASIC, so that the package 100 may be used as a flash memory device. It is understood that the package 100 may include semiconductor die configured to perform other functions in further embodiments of the present invention.

Although not critical to the present invention, substrate 104 may be a variety of different chip carrier mediums, including a PCB, a leadframe or a TAB tape. Where substrate 104 is a PCB, the substrate may be formed of a core having top and/or bottom conductive layers formed thereon. The core may be various dielectric materials such as for example, polyimide laminates, epoxy resins including FR4 and FR5, bismaleimide triazine (BT), and the like. The conductive layers may be formed of copper or copper alloys, plated copper or plated copper alloys, Alloy 42 (42FE/58NI), copper plated steel or other metals or materials known for use on substrates. The conductive layers may be etched into a conductance pattern as is known for communicating signals between the semiconductor die and an external device. A dummy pattern may also be provided in the conductive layers as is known to reduce mechanical stresses on the substrate otherwise resulting from uneven thermal expansion within the substrate. Substrate 104 may additionally include exposed metal portions forming contact pads (not shown) for receiving wire bonds and/or contact fingers (not shown) where the package 100 is an LGA package. The contact pads and/or fingers may be plated with one or more gold layers, for example in an electroplating process as is known in the art.

Where substrate 104 is a leadframe, the leadframe may be formed of a planar or substantially planar piece of metal, such as copper or copper alloys, plated copper or plated copper alloys, Alloy 42 (42Fe/58Ni), or copper plated steel. The leadframe may also be plated with silver, gold, nickel palladium, or copper. The individual leads for bonding to die 102 may be formed by photolithographic processes or mechanical stamping.

The semiconductor die 102 may be bonded to the substrate 104 in a known die bond process. After die 102 are affixed to substrate 104, bond wires 106 may be attached between bond pads on die 100 and bond pads on substrate 104. Bond wires 106 may be affixed in a known wire bonding process. Wire bonds 106 may be provided along a single side, or along two, three or four sides of die 102 and substrate 104. The package 100 may further include passive components 108, such as for example capacitors, resistors and inductors further enabling the operation of the package 100.

Once electrical connections between the die and substrate are made, the respective packages 100 may then typically be encapsulated in a molding compound 110 to seal off and protect the components within the package. Molding compound 110 may be a known epoxy such as for example available from Sumitomo Corp. and Nitto Denko Corp., both having headquarters in Japan. In one embodiment, the package 100 may be a Memory Stick Micro (M2) card, but it is understood that package 100 may be a wide variety of other semiconductor packages, including for example a Transflash card and an SD card.

Where package 100 is a Memory Stick Micro card, the package 100 may include four edges 122-128 defining a generally rectangular shaped card. The corners between the respective edges may be rounded. Edge 124 may include a notch 130 and edge 128 may include a pair of notches 130, which notches aid in the positioning of the package 100 within a host device. Edges 124 and 128 may further include a pair of guide rails 134 (seen more clearly in the perspective views of FIGS. 8 and 9) having a lower profile than an upper surface 136 of the package 100. The guide rails 134 are used to guide the package 100 upon insertion into a host device. In particular, upon insertion of the package 100 into a host device, loading mechanisms within the host device are engaged by guide rails 134 in a known manner. The upper surface 136 may further be formed with a finger grip 140 to aid in insertion and/or withdrawal of the device with respect to a host device.

After encapsulation, the semiconductor packages 100 may be singulated from the panel to provide the package 100 shown in the top view of FIG. 5 and cross-sectional view of FIG. 6. The package 100 may be singulated using one or more of a variety of cutting methods, including for example diamond saw cutting for cutting straight edges, and water jet or laser cutting for cutting curvilinear shaped edges. As used herein, curvilinear edges include curved edges, non-straight edges and discontinuous edges (i.e., two edges that come together at an oblique angle). In embodiments, the curvilinear edges may be cut in a first cutting process and the straight edges may be cut in a second cutting process. The package 100 may be singulated from panel 90 in a single cutting process in alternative embodiments. As indicated in the Background section, some cutting processes, such as for example those for making curvilinear cuts, may produce jagged edges 120 which may be any of the edges discussed below.

As is also discussed in the Background section, the roughness of conventional package edges may cause the package to get stuck within a host device. Therefore, in accordance with the present invention, it is contemplated that some or all of the edges of package 100 may be smoothed by applying a coating, or laminate, to the edges. Referring in particular to the top view of FIG. 7 and the partial perspective view of FIG. 8, a laminate 150 may be applied to any edge of semiconductor package 100. These edges include any edge between a top and bottom surface of the package 100, including edge 122, edge 124, edge 126 and/or edge 128. The rounded corners between the edges 122-128 are also edges which may receive laminate 150. The laminate 150 may also or alternatively be applied to any notches 130 or chamfers which may be formed in an edge of the package.

The laminate 150 is shown in solid in FIG. 7 and cross-hatched in FIG. 8. The thickness of the laminate is not drawn to scale in FIG. 7. In an embodiment, the laminate 150 may be applied to the front corners (i.e., inserted first into a host device) of the card between edges 122 and 124, and between edges 122 and 128. The laminate 150 may be applied on the guide rails 134, but the laminate may be applied to edge portions on edges 124 and 128 other than the guide rails 134. As opposed to being provided along a corner, the laminate 150 may also or alternatively cover one or more entire sides. For example, in the alternative embodiment of FIG. 9, the laminate 150 is applied to the front corners as shown in FIG. 8, and also along the entire front edge 122. It is further understood that some laminate may also be applied to the top surface 136 of package 100 and/or the bottom surface of package 100 opposite top surface 136. Other packages may be formed with side edges which do not have guide rails formed therein. In such embodiments, the laminate may be to the entire surface area of a side edge, or a portion of the surface area of a side edge.

Laminate 150 may be a variety of compounds applied as a liquid and thereafter cured or hardened to form a solid, smooth layer around the edges to which it is applied. In one embodiment, the laminate may be an ink epoxy applied as an A stage liquid and then cured to a C stage solid. Such ink epoxies have been used in the past, for example for marking semiconductor packages, and are available from Markem Corporation of Keene, N.H. The laminate 150 may be a wide variety of other compounds in alternative embodiments, including for example other resins, plastics, polymers, enamels, acrylics, Urethane and/or ceramics. Other materials known for use in marking semiconductor packages may also be used.

The laminate 150 may be applied as a thin film which thereafter hardens, either at atmospheric temperature (air drying) or by curing. Where laminate 150 is an ink epoxy, it may for example be cured at a temperature of 120°. As opposed to heating, some laminates may be cured by UV or other types of radiation. In embodiments, the laminate 150 may have a roughness, Ra, of less than 1 μm. It is understood that laminate 150 may have a roughness of greater than 1 μm in alternative embodiments. The hardened laminate 150 may also have a thickness of between 5 μm and 50 μm and more particularly between 20 μm and 40 μm. It is understood that the laminate may have a thickness greater than or lesser than these ranges in alternative embodiments.

In embodiments, the laminate 150 may be applied after the package 100 has been singulated from panel 90. In such embodiments, the laminate 150 may be manually swabbed onto the desired locations of package 100. Alternatively, the package 100 may be transferred to a holding station and the laminate applied robotically. In a further embodiment of the present invention, the laminate 150 may be applied prior to final singulation of the package 100 from panel 90.

In particular, as explained above, the singulation process may take place in two separate cutting processes. The curvilinear edges may be cut in a first process and the straight edges may be cut in a second process. Accordingly, after the first cutting process, the panel 90 may be transferred to a tool where the laminate 150 is applied to the front corners which have been cut, as well as other curvilinear sections. After the laminate 150 is applied as desired, the second cutting process may be performed. As the second cutting process may provide cut surfaces with a smooth edge, the laminate need not be applied to such edges. However, it is understood that in alternative embodiments, the laminate 150 may be applied to any edges of package 150, whether cut by a curvilinear edge cutting process or by a straight edge cutting process.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package, comprising:
    a substrate;
    one or more semiconductor die electrically coupled to the substrate;
    molding compound encapsulating the one or more semiconductor die and at least a portion of the substrate, at least one of the substrate and molding compound defining an upper surface of the package, a lower surface of the package and one or more edges extending between the upper and lower surfaces of the package; and
    a laminate applied to at least one of the one or more edges for reducing a roughness of the one or more edges.

2. A semiconductor package as recited in claim 1, wherein the at least one edge to which the laminate is applied includes a curvilinear edge.

3. A semiconductor package as recited in claim 1, wherein the at least one edge to which the laminate is applied includes one or more front corners of the package.

4. A semiconductor package as recited in claim 1, wherein the at least one edge to which the laminate is applied includes a straight edge.

5. A semiconductor package as recited in claim 1, further comprising one or more guide rails formed in the molding compound.

6. A semiconductor package as recited in claim 5, wherein the at least one edge to which the laminate is applied includes the guide rails.

7. A semiconductor package as recited in claim 1, wherein the laminate comprises an epoxy resin.

8. A semiconductor package as recited in claim 1, wherein the laminate comprises a curable epoxy resin.

9. A semiconductor package as recited in claim 1, wherein the laminate comprises an ink epoxy.

10. A semiconductor package as recited in claim 1, wherein the laminate comprises one or more of a plastic, polymer, enamel, acrylic, Urethane and ceramic.

11. A semiconductor package as recited in claim 1, wherein the laminate provides the at least one edge with a surface roughness of less than 1 micron.

12. A semiconductor package as recited in claim 1, wherein the laminate has a thickness of between 5 microns and 50 microns.

13. A semiconductor package as recited in claim 1, wherein the one or more semiconductor die include a flash memory die.

14. A semiconductor package as recited in claim 13, wherein the one or more semiconductor die include a controller die.

15. A semiconductor package as recited in claim 1, wherein the semiconductor package is one of a Memory Stick Micro card, a Transflash card and a Secure Digital card.

16. A semiconductor package, comprising:
    a substrate;
    one or more semiconductor die electrically coupled to the substrate;
    molding compound encapsulating the one or more semiconductor die and at least a portion of the substrate, at least one of the substrate and molding compound defining an upper surface of the package, a lower surface of the package and one or more edges extending between the upper and lower surfaces of the package; and
    a laminate applied to at least one of the one or more edges for reducing a roughness of the one or more edges;
    the semiconductor package formed by the steps of:
    (a) encapsulating at least one semiconductor die and at least part of a substrate in a molding compound;
    (b) singulating the semiconductor package from the panel by making one or more cuts through the panel to define edges in the semiconductor package; and
    (c) manually applying an epoxy resin to one or more of the edges to reduce the roughness of the one or more edges.

17. The semiconductor package of claim 16, wherein said step (c) of manually applying an epoxy resin to the one or more edges comprises the step of applying the epoxy resin to a curvilinear edge.

18. The semiconductor package of claim 16, wherein said step (c) of manually applying an epoxy resin to the one or more edges comprises the step of applying the epoxy resin to a straight edge.

19. The semiconductor package of claim 16, wherein said step (c) of manually applying an epoxy resin to the one or more edges comprises the step of applying the laminate as a liquid, the method further comprises the step (d) of hardening the liquid.

20. The semiconductor package of claim 16, wherein said step (d) of hardening the liquid comprises one of air drying the liquid and curing the liquid.

21. The semiconductor package of claim 16, wherein said step (c) of manually applying an epoxy resin to one or more of the edges to reduce the roughness of the one or more edges reduces the roughness of the one or more edges to less than 1 micron.

* * * * *